(12) United States Patent
Kim et al.

(10) Patent No.: US 8,493,069 B2
(45) Date of Patent: Jul. 23, 2013

(54) METHOD AND APPARATUS FOR DISPLAYING STATE OF CURRENT CONSUMPTION OF A BATTERY IN PORTABLE TERMINAL

(75) Inventors: Sun-Ho Kim, Gumi-si (KR); Hwan-Gee Jang, Gumi-si (KR); Woo-Sun Yoon, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 439 days.

(21) Appl. No.: 12/944,998

(22) Filed: Nov. 12, 2010

(65) Prior Publication Data

US 2011/0109317 A1    May 12, 2011

(30) Foreign Application Priority Data

Nov. 12, 2009  (KR) .................. 10-2009-0109359

(51) Int. Cl.
*G01N 27/416* (2006.01)

(52) U.S. Cl.
USPC ........................... 324/426; 324/433; 324/435

(58) Field of Classification Search
None
See application file for complete search history.

(56) References Cited

U.S. PATENT DOCUMENTS

| 6,134,457 | A  | * | 10/2000 | Ha et al. ...................... | 455/572 |
| 6,384,578 | B1 | * | 5/2002 | Patino et al. .................. | 320/149 |
| 6,538,449 | B2 | * | 3/2003 | Juncker et al. ............... | 324/429 |

\* cited by examiner

*Primary Examiner* — Minh N Tang
(74) *Attorney, Agent, or Firm* — Jefferson IP Law, LLP

(57) ABSTRACT

A method and apparatus for displaying a state of current consumption of a battery in a portable terminal are provided. The method includes measuring a value of consumed current at a preset period, supplying the measured current value to an Analog-to-Digital Converter (ADC) through an ADC port, confirming battery compensation offset values by the ADC, determining whether values corresponding to the battery compensation offset values are present in a preset table, and if it is determined that the values are present, calculating a battery voltage level compensation value with reference to the table, applying the battery voltage level compensation value to an actual detected voltage, and displaying a remaining amount of the battery according to the compensation value applied voltage.

18 Claims, 2 Drawing Sheets

METHOD AND APPARATUS FOR DISPLAYING STATE OF CURRENT CONSUMPTION OF A BATTERY IN PORTABLE TERMINAL

PRIORITY

This application claims the benefit under 35 U.S.C. §119 (a) of a Korean patent application filed in the Korean Intellectual Property Office on Nov. 12, 2009 and assigned Serial No. 10-2009-0109359, the entire disclosure of which is hereby incorporated by reference.

BACKGROUND OF THE INVENTION

1. Field of the Invention

The present invention relates to a portable terminal. More particularly, the present invention relates to a method and apparatus for displaying a state of current consumption of a battery in a portable terminal.

2. Description of the Related Art

In a general portable terminal, remaining capacity of a battery is displayed by measuring a voltage stored in a battery pack. However, the actual capacity of the battery pack varies with the amount of current consumed in a main body of the portable terminal, that is, an internal circuit of the portable terminal. If the amount of consumed current is abruptly increased according to a service provided by the portable terminal, the voltage of the battery pack is temporarily lowered, and if the amount of consumed current is decreased, the voltage of the battery pack is normally raised again.

In this case, a battery remaining capacity indication bar, which is indicated on a display means of the portable terminal, may be abnormally decreased and again increased, thereby confusing users.

Therefore, a need exists for a method and apparatus for determining current consumption of a battery and displaying accurate remaining capacity of the battery.

SUMMARY OF THE INVENTION

An aspect of the present invention is to address at least the above-mentioned problems and/or disadvantages and to provide at least the advantages described below. Accordingly, an aspect of the present invention is to provide an apparatus and method for displaying a state of current consumption of a battery by compensating a voltage through a compensation value determined by measuring the amount of current of the battery varying with the amount of current consumed according to a service type and a provided function, thereby accurately informing a user of the remaining capacity of the battery.

In accordance with an aspect of the present invention, a method for displaying a state of current consumption of a battery in a portable terminal is provided. The method includes measuring a value of consumed current at a preset period, supplying the measured current value to an Analog-to-Digital Converter (ADC) through an ADC port, confirming battery compensation offset values by the ADC, determining whether values corresponding to the battery compensation offset values are present in a preset table, and if it is determined that the values are present, determining a battery voltage level compensation value with reference to the table, applying the battery voltage level compensation value to an actual detected voltage, and displaying a remaining amount of the battery according to the compensation value applied voltage.

In accordance with another aspect of the present invention, an apparatus for displaying a state of current consumption of a battery in a portable terminal is provided. The apparatus includes a battery, a battery voltage sensor for detecting a voltage of the battery, and a controller for controlling an overall operation of the portable terminal, for determining a battery voltage level compensation value using a preset table in which a relationship between a current and a voltage for each battery type associated with each service type of the portable terminal is preset, for applying the battery voltage level compensation value to the voltage of the battery sensed by the battery voltage sensor, and for displaying a remaining amount of the battery according to a battery voltage.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, the same drawing reference numerals will be understood to refer to the same elements, features and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

A portable terminal which will be described below denotes a multi-purpose terminal which provides services through a wired/wireless public network. However, the portable terminal is not limited thereto. Accordingly, the portable terminal according to an exemplary embodiment of the present invention may be a mobile communication terminal or may be applied to all information communication devices, multimedia devices and application devices thereof. For example, the portable terminal may be a digital broadcasting terminal, a Personal Digital Assistant (PDA), a smart phone, and a 3$^{rd}$ Generation (3G) terminal such as an International Mobile Telecommunication 2000 (IMT 2000) terminal, a Wideband Code Division Multiple Access (WCDMA) terminal, a Global System for Mobile Communication/General Packet Radio Service (GSM/GPRS), and a Universal Mobile Telecommunication Service (UMTS) terminal.

Figure 1:
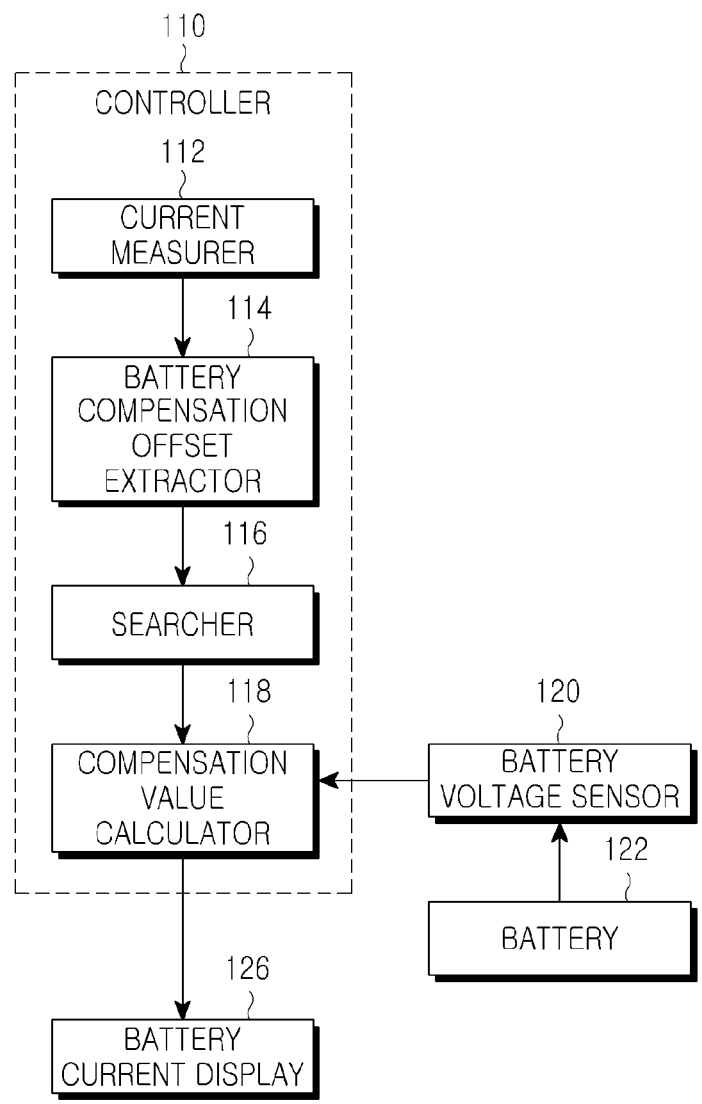
FIG. 1 is a block diagram illustrating an apparatus for displaying a state of current consumption of a battery in a portable terminal according to an exemplary embodiment of the present invention.

FIG. 1 is a block diagram illustrating an apparatus for displaying a state of current consumption of a battery in a portable terminal according to an exemplary embodiment of the present invention.

Referring to FIG. 1, the apparatus for displaying a state of current consumption of a battery in a portable terminal includes a controller 110, a battery voltage sensor 120, and a battery 122. The controller 110 includes a current measurer 112, a battery compensation offset extractor 114, a searcher 116, and a compensation value calculator 118.

The current measurer 112 measures a value of current consumed in the portable terminal at a preset period. The current refers to current supplied to an internal circuit of the portable terminal from the battery 122 included in the portable terminal. A value of the measured current is applied to the battery compensation offset extractor 114 through an Analog-to-Digital Converter (ADC) port.

The battery compensation offset extractor 114 includes an ADC (not illustrated) for converting an analog signal into a digital signal. The ADC converts the current value into a digital value according to a voltage level of the battery 122 generated from the battery voltage sensor 120 and extracts battery compensation offset values according to a characteristic of the ADC.

The battery compensation offset values include the measured current value, a battery type, and a battery power/voltage value.

The searcher 116 determines whether values corresponding to the battery compensation offset values exist in a preset table.

In the preset table, the relationship between a current and a voltage for each battery type associated with each service type of the portable terminal may be preset. The service type includes a video call service, a Digital Multimedia Broadcasting (DMB) service, a second generation service, and a third generation service.

More specifically, specialized services provided by the portable terminal which consume much current, that is, a video call service or a DMB service, may include different amounts of consumed current based on an execution of a main function by a selection of a user. Accordingly, the relationship between a current and a voltage for each battery type varying according to a service type may be preset in the table.

For example, the table may be a standard table which may be set to compensate a voltage by generating a voltage drop only when the amount of consumed current is above 100 mA during a video call service or when the amount of consumed current is above 30 mA during photographing of an image, in a portable terminal having an output voltage of 4.2 V.

The battery 122 consumes current differently according to a specialized service or a main function provided by the portable terminal.

The compensation value calculator 118 determines a battery voltage level compensation value with reference to the table. More specifically, the compensation value calculator 118 searches the table for the battery compensation offset values, that is, a measured current value, a battery type, and a battery power/voltage value. If values corresponding to the battery compensation offset values are present in the table, the compensation calculator 118 determines the battery voltage level compensation value with reference to the relationship between a current and a voltage.

In an exemplary implementation, compensation constants may be previously stored in the compensation value calculator 118 of the portable terminal.

The compensation constants are applied differently to a voltage of the battery since the amount of a voltage drop for consumed current varies according to the battery's capacity. The compensation constants may be determined randomly.

If the values corresponding to the battery compensation offset values do not exist in the table, the battery compensation offset values are added and stored in the table.

The compensation value determined by the compensation value calculator 118 is provided by a battery current display 126 which applies the compensation value to a measurement voltage of the battery 122 generated from the battery voltage sensor 120 and displays the battery current.

An operation for displaying the battery current of the portable terminal will be described below in more detail with reference to FIG. 2.

Figure 2:
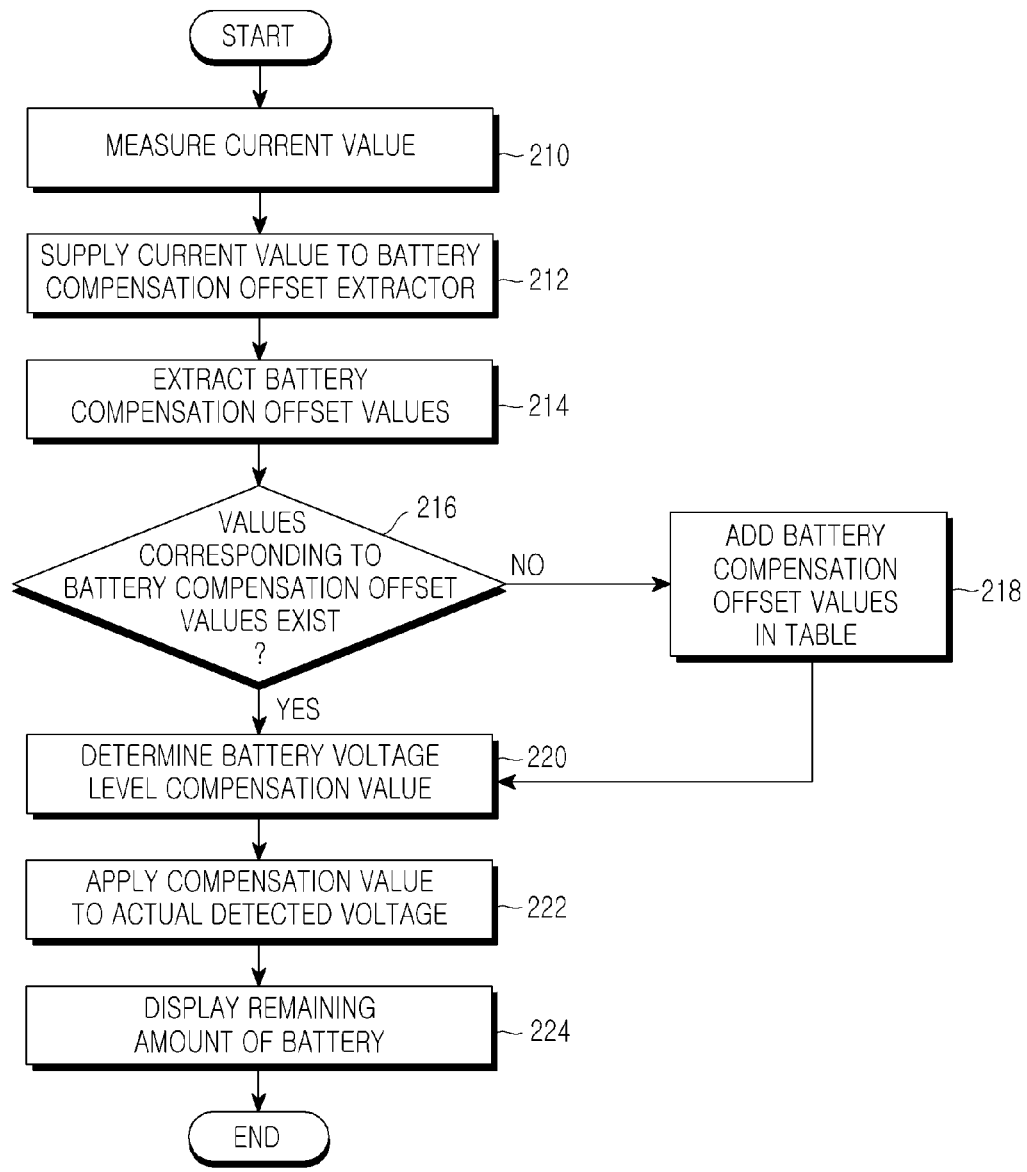
FIG. 2 is a flowchart illustrating a process for displaying a state of current consumption of a battery in a portable terminal according to an exemplary embodiment of the present invention.

FIG. 2 is a flowchart illustrating a process for displaying a state of current consumption of a battery in a portable terminal according to an exemplary embodiment of the present invention.

Referring to FIG. 2, the controller 110 measures a value of consumed current at a preset period in step 210.

The current refers to current supplied to an internal circuit of the portable terminal from the battery included in the portable terminal. The measured current value is applied to the battery compensation offset extractor 114 through an ADC port in step 212.

In step 214, battery compensation offset values are extracted. The controller 100 determines whether values corresponding to the battery compensation offset values exist in a preset table in step 216.

In the table, the relationship between a current and a voltage for each battery type associated with each service type of the portable terminal may be preset. The service type includes a video call service, a DMB service, a second generation service, and a third generation service.

More specifically, specialized services provided by the portable terminal which consume current, that is, a video call service or a DMB service, may include different amounts of consumed current based on an execution of a main function by a selection of a user. Accordingly, the relationship between a current and a voltage for each battery type varying according to a service type may be preset in the table.

If it is determined in step 216 that the values corresponding to the battery compensation offset values exist, the controller 110 determines a battery voltage level compensation value with reference to the table in step 220.

In an exemplary implementation, compensation constants may be previously stored in the portable terminal.

The compensation constants are applied differently to a voltage of the battery since the amount of a voltage drop for consumed current varies according to the battery's capacity. The compensation constants may be determined randomly.

The battery voltage level compensation value is applied to an actual detected value in step 222.

If it is determined in step 216 that the values corresponding to the battery compensation offset values do not exist in the table, the battery compensation offset values are added and stored in the table in step 218.

In step 224, the remaining amount of the battery according to a compensation value applied voltage is displayed.

According to exemplary embodiments of the present invention, the state of current consumption of a battery in a portable terminal is displayed by compensating a voltage through a compensation value determined by measuring the amount of current of the battery varying with the amount of current consumed according to a service type and a provided function. Thereby, the portable terminal can accurately inform a user of the remaining capacity of the battery.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for displaying a state of current consumption of a battery in a portable terminal, the method comprising:
   measuring a value of consumed current at a preset period;
   supplying the measured current value to an Analog-to-Digital Converter (ADC) through an ADC port;
   confirming battery compensation offset values by the ADC;
   determining whether values corresponding to the battery compensation offset values are present in a preset table, and if it is determined that the values are present, determining a battery voltage level compensation value with reference to the table;
   applying the battery voltage level compensation value to an actual detected voltage; and
   displaying a remaining amount of the battery according to the compensation value applied voltage.

2. The method of claim 1, wherein the battery compensation offset values comprise at least one of a current value, a battery type, and a battery power/voltage value.

3. The method of claim 1, wherein the table includes a preset relationship between a current and a voltage for each battery type associated with each service type of the portable terminal.

4. The method of claim 1, further comprising:
   adding the battery compensation offset values to the table if the values corresponding to the battery compensation offset values are not present in the table.

5. The method of claim 3, wherein the service type of the portable terminal comprises at least one of a video call service, a Digital Multimedia Broadcasting (DMB) service, a second generation service, and a third generation service.

6. The method of claim 1, wherein the battery includes different amounts of current consumption according to a specialized service provided by the portable terminal and a function provided in the portable terminal.

7. An apparatus for displaying a state of current consumption of a battery in a portable terminal, the apparatus comprising:
   a battery;
   a battery voltage sensor for detecting a voltage of the battery; and
   a controller for controlling an overall operation of the portable terminal, for determining a battery voltage level compensation value using a preset table in which a relationship between a current and a voltage for each battery type associated with each service type of the portable terminal is preset, for applying the battery voltage level compensation value to the voltage of the battery detected by the battery voltage sensor, and for displaying a remaining amount of the battery according to the battery voltage.

8. The apparatus of claim 7, wherein the controller comprises:
   a current measurer for measuring a value of current consumed in the portable terminal at a preset period;
   a battery compensation offset extractor for receiving the current value measured by the current measurer through an Analog-to-Digital Converter (ADC) port, for converting an analog signal into a digital signal, and for extracting the battery compensation offset values according to a digital conversion characteristic;
   a searcher for determining whether values corresponding to the battery compensation offset values are present in the preset table; and
   a compensation value calculator for determining the battery voltage level compensation value with reference to the preset table.

9. The apparatus of claim 8, wherein the battery compensation offset values include a current value, a battery type, and a battery power/voltage value.

10. The apparatus of claim 7, wherein the service type of the portable terminal comprises at least one of a video call service, a Digital Multimedia Broadcasting (DMB) service, a second generation service, and a third generation service.

11. The apparatus of claim 7, wherein the battery includes different amounts of current consumption according to a specialized service provided by the portable terminal and a function provided in the portable terminal.

12. A method for displaying a state of current consumption of a battery in a portable terminal, the method comprising:
   detecting a voltage of the battery;
   measuring a value of consumed current in the portable terminal at a preset period;
   supplying the measured current value to an Analog-to-Digital Converter (ADC) through an ADC port;
   extracting battery compensation offset values according to a digital conversion characteristic;
   determining a battery voltage level compensation value using a preset table;
   applying the battery voltage level compensation value to the voltage of the battery; and
   displaying a remaining amount of the battery according to the compensation value applied voltage.

13. The method of claim 12, wherein the battery compensation offset values comprise at least one of a current value, a battery type, and a battery power/voltage value.

14. The method of claim 12, wherein the table includes a preset relationship between a current and a voltage for each battery type associated with each service type of the portable terminal.

15. The method of claim 14, wherein the service type of the portable terminal comprises at least one of a video call service, a Digital Multimedia Broadcasting (DMB) service, a second generation service, and a third generation service.

16. The method of claim 12, further comprising:
   determining whether values corresponding to the battery compensation offset values are present in the preset table.

17. The method of claim 16, further comprising:
   adding the battery compensation offset values to the table if it is determined that the values corresponding to the battery compensation offset values are not present in the table.

18. The method of claim 12, wherein the battery includes different amounts of current consumption according to a specialized service provided by the portable terminal and a function provided in the portable terminal.

\* \* \* \* \*